United States Patent [15] 3,652,273
Htoo [45] Mar. 28, 1972

[54] PROCESS USING POLYVINYL BUTRAL TOPCOAT ON PHOTORESIST LAYER

[72] Inventor: Maung S. Htoo, Poughkeepsie, N.Y.
[73] Assignee: International Business Machines Corporation

[22] Filed: Sept. 11, 1967
[21] Appl. No.: 666,860

[52] U.S. Cl. ....96/36, 96/35.1, 96/36.2, 96/36.3, 117/6, 117/72
[51] Int. Cl. ....G03c 5/00
[58] Field of Search ....96/115, 36, 35.1, 36.2, 36.3; 117/34, 6, 72

[56] References Cited

UNITED STATES PATENTS

| | | | |
|---|---|---|---|
| 2,732,304 | 1/1956 | Vanselow et al. | 96/67 |
| 3,458,311 | 7/1969 | Alles | 96/35.1 |
| 3,518,084 | 6/1970 | Barson et al. | 96/36.2 |
| 2,819,164 | 1/1958 | Boersma | 96/115 |
| 3,155,509 | 11/1964 | Roscow | 117/34 |
| 3,471,294 | 10/1969 | Van der Sanden et al. | 96/93 |

FOREIGN PATENTS OR APPLICATIONS

| | | | |
|---|---|---|---|
| 659,130 | 5/1965 | Belgium | |
| 1,447,936 | 11/1968 | Germany | 96/36.3 |
| 944,276 | 12/1963 | Great Britain | |

OTHER PUBLICATIONS

Robert Reed, " Offset Platemaking," Lithographic Technical Foundation, 131 E. 39th St., NY 16, NY, 3rd ed., 1963; pp. 34, 35, 42-45

*Primary Examiner*—Norman G. Torchin
*Assistant Examiner*—John Winkelman
*Attorney*—Hanifin and Jancin and Julius B. Kraft

[57] ABSTRACT

An improved process for the formation of photo-resist patterns on substrates by coating the subtrate with a layer of a synthetic resin photo-resist composition, applying a topcoat of vinyl butyral polymer over the photo-resist, exposing the photo-resist to a light pattern through a mask and the transparent topcoat, and removing the photo-resist from the unexposed areas with a conventional predominantly aromatic hydrocarbon developer which also removes the topcoat. The use of the topcoat eliminates scumming of the substrate due to residual insoluble photo-resist in the unexposed areas of the resist layer, and reduces pinholing in the exposed areas.

9 Claims, 4 Drawing Figures

*INVENTOR*
MAUNG S. HTOO

ATTORNEY

PROCESS USING POLYVINYL BUTRAL TOPCOAT ON PHOTORESIST LAYER

BACKGROUND OF THE INVENTION

1. Field of Invention

This invention relates to photo-resist formation. A photo-resist may be described as a protective stencil on a surface formed by the exposure of a light sensitive layer on said surface to a master pattern. The presence of this protective stencil permits modification of the surface in a pattern corresponding to that of the stencil. More particularly, the present invention is concerned with preserving the distinctiveness and uniformity of the photo-resist pattern with respect to covered and uncovered areas.

2. Prior Art

In accordance with conventional practice in photo-resist systems, a layer of photo-sensitive material is coated on a substrate and then exposed to light through a masking image of pattern so that a change in the solubility of the layer takes place. Usually the material becomes more insoluble where exposed. Then the layer is treated in a solvent which removes the more soluble parts to leave a stencil or photo-resist in an image pattern on the substrate. This image then acts as a resist against the action of chemical attack with acid, alkalis or other solvents and etchants for the substrate. The resist can also provide a protective stencil for deposition of metals, sandblasting, and more recently for use in the formation of semiconductor devices by diffusion.

An overall survey of the background of the present photo-resist art may be found in the article "The Photo-Resist Story—From Niepce to the Modern Polymer Chemist" by M. Hepher, appearing at pages 181–190, Journal of Photographic Science, Volume 12, 1964. The original photo-resists were natural colloids such as albumen or gelatin sensitized by potassium dichromate. However, because of problems involving storage stability, water permeability and less than satisfactory resistance to certain etchants by these natural colloids, the modern photo-resist art has developed many synthetic resin photo-resist compositions which provide resist patterns of increased hydrophobicity. Many of the synthetic resins utilized in such photo-resists have some inherent light sensitivity, e.g., polyvinyl cinnamate; others depend primarily on light sensitizers contained in the photo-resist composition to initiate a cross-linking or insolubilizing reaction when exposed to light. A description of the synthetic resins and the light sensitizers presently used to provide hydrophobic photo-resist patterns may be found in the above-mentioned article and in the text "Light Sensitive Systems" by Jaromir Kosar, particularly at chapter 4. Some photo-resist compositions of this type are described in U.S. Pat. Nos. 2,610,120; 3,143,423; and 3,169,868.

Primary among the problems encountered with the use of photo-resist for the manufacture of microelectronic circuits and components is the problem of preserving the distinctiveness and uniformity of the photo-resist pattern with respect to the covered and uncovered areas on the substrate. Two conditions which interfere with this distinctiveness and uniformity of the photot-resist pattern are pinholing of the photo-resist in the covered areas of the pattern and the failure of the solvent to completely remove the photo-resist from the uncovered areas in the pattern. One manifestation of the latter condition is the effect known as scumming. Scumming is a formation of a film of insoluble photo-resist in the uncovered areas of the pattern. This scumming obviously interferes with any etching or other modification of the uncovered substrate.

In the graphic arts, the phenomena of pinholing and scumming, while having an effect of varying degrees on the visual or graphic effect produced, is not usually a fatal or critical flaw. On the other hand, in the formation of microelectronic printed circuits or in the diffusion into semiconductor wafers pinholing or scumming are fatal flaws. Such imperfections will usually result in short-circuits or incomplete circuits or connections.

The chemical mechanism of the phenomenon of scumming is not understood in the art. However, it has been observed that under conditions of high relative humidity in the ambient, as found in many areas during the summer months, scumming appears during the formation of resist patterns from many synthetic resin photo-resist compositions, particularly compositions in which the resin is a cinnamic acid ester of polyvinyl alcohol. Pinholing is a problem with virtually all photo-resist compositions. In many cases, some pinholing may be tolerated. However, excessive pinholing is a fatal flaw in microelectronic components and circuit fabrication.

The present invention solves the scumming problem in compositions subject to this problem and, in addition, reduces pinholing in photo-resist.

SUMMARY OF THE INVENTION

The present invention relates to an improvement in photo-resist pattern formation which eliminates scumming and reduces pinholing by applying a film of polymeric vinyl butyral to the photo-resist layer prior to the exposure of the photo-resist layer to the selected light image pattern. This polymer film is soluble in the developers used to develop the photo-resist pattern and is removed during the developing step. A method of forming hydrophobic photo-resist patterns on substrates in accordance with the present invention involves the steps of coating the substrate with a layer of a conventional synthetic photo-resist, covering the layer with a topcoat of vinyl butyral polymer, exposing the coated substrate to an image light pattern, e.g., through a mask, treating the exposed structure with a conventional photo-resist liquid developer to remove the removable portion of the photo-resist composition together with the polyvinyl butyral polymer topcoat to leave a photo-resist pattern corresponding to the light image pattern.

Preferably, the polyvinyl butyral polymer is a copolymer comprising vinyl alcohol, vinyl acetate and a major portion of polyvinyl butyral.

The foregoing and other objects, features and advantages of the invention will be apparent from the following more particular description and preferred embodiments of the invention as illustrated in the accompanying drawings.

DESCRIPTION OF PREFERRED EMBODIMENTS

Figure 1:
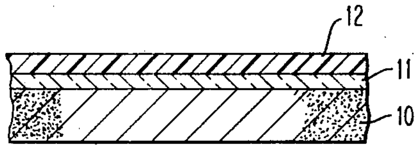
FIGS. 1–4 are cross-sectional, diagrammatic views of a section of coated silicon wafer during the steps of photo-resist pattern formation in accordance with the present invention.
Figure 2:
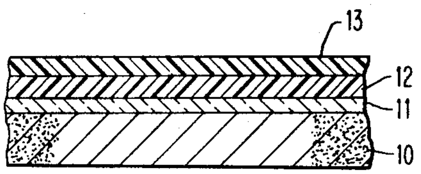

As an illustrative example of a preferred embodiment, a protective photo-resist pattern is formed on a silicon wafer during an impurity diffusion process in the following manner: A silicon dioxide layer 11, FIG. 1, is conventionally formed on a silicon wafer 10 surface by heating the wafer in an oxidizing atmosphere. A coating 12, about 7,000 A. dry thickness, of a photo-resist composition comprising polyvinyl cinnamate resin and a light sensitizer, 1-methyl-2-benzoylmethylene-$\beta$-naphthothiazole is applied over the silicon dioxide layer 11 as a solution (8.5 percent solids by weight) in a volatile solvent, 86.5 percent chlorobenzene and 13.5 percent cyclohexanone which is dried to provide the coating. A coating 13, FIG. 2, of a copolymer (average M.W. 45,000–55,000) of 88 percent copolymerized vinyl butyral, an average of 11 percent copolymerized vinyl alcohol and the remainder vinyl acetate is applied over the photo-resist layer 12 as a 2.5 percent solution (solids content by weight) in isopropanol and dried to a thickness of about 1,000 A.

Figure 3:
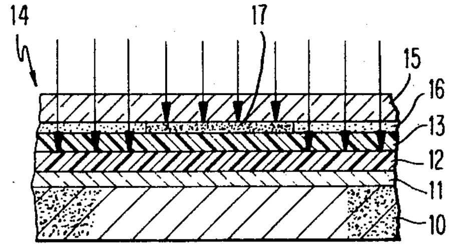

The surface of coating 13 is then contacted, as shown in FIG. 3, by conventional photographic mask 14 consisting of a transparent base 15 and transparent fixed photographic emulsion 16 in which the masking opaque image 17 is formed. The photo-resist is then exposed to light passing through the unmasked areas of mask 14 and transparent coating 13. The light source, a 200-watt high pressure mercury-vapor lamp, provides light within the sensitivity range of the photo-resist used.

Figure 4:
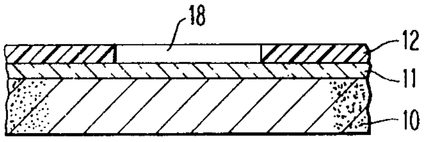

Then, the exposed wafer is developed with a predominantly volatile aromatic hydrocarbon solvent consisting of 22 percent cyclohexanone and 78 percent technical grade xylene (10.3 to 10.9 percent ethylbenzene, 10.7 to 12.1 percent o-xylene, 44.9 to 48.0 percent m-xylene, and 9.3 to 10.3 percent p-xylene) which removes the polyvinyl butyral copolymer coating 13 and the unexposed photo-resist layer to leave a photo-resist pattern 12, FIG. 4, with holes 18 corresponding to the masked or unexposed area.

The wafer with the photo-resist pattern thereon is then processed conventionally. The photo-resist is baked to harden the pattern and the silicon dioxide layer beneath holes 18 is removed by a standard aqueous hydrofluoric acid etchant to expose the silicon wafer in the hole areas. The remaining photo-resist is removed by conventional stripping. Conductivity-determining impurities are then diffused through the holes in the silicon dioxide layer, previously formed under resist opening 18, into the silicon wafer by any of the conventional techniques.

In silicon wafers processed in accordance with this example, the scumming in the holes 18 of the photo-resist pattern is found to be completely absent, even under ambient conditions of high relative humidity usually present during summer months. On the other hand, in the case of silicon wafers processed in accordance with the procedure of the above example, except that the polyvinyl butyral copolymer coating is eliminated, scumming is evident. During summer months, the scumming in the holes 18 is sufficient to render from 20 to 100 percent of the wafers unfit for further processing.

In order to determine the effect of the polyvinyl butyral coating in the reduction of pinholing, the procedure of the above example is repeated, except that the polyvinyl butyral copolymer coating 13 is eliminated. After the silicon dioxide is removed from the areas beneath the holes by conventional etchants, a determination is made as to the extent of pinholing in the areas covered by the photo-resist pattern during etching. In a randomly selected area, a wafer which was processed without the polyvinyl butyral copolymer coating evidenced 202 pinholes in the silicon dioxide layer as compared to 45 pinholes in an equivalent area of the silicon dioxide layer of a wafer processed with the polyvinyl butyral copolymer layer.

As illustrated, the present invention provides very effective results in preserving the distinctiveness and uniformity of the photo-resist pattern where the photo-resist composition comprises polymeric cinnamic acid esters of the type described in U.S. Pat. No. 2,610,120. In addition, beneficial effects in preserving the distinctiveness and uniformity of photo-resist patterns are also provided with synthetic resin photo-resist compositions in general such as polystyrenes, copolymers of styrene and butadiene, polycis-1, 4-isoprene and styryl acrylic acid polyesters of polyvinyl alcohol. The photo-resist compositions may contain any conventional light sensitizers such as azides of the type described in U.S. Pat. No. 3,143,423.

Vinyl butyral polymers have solubility properties which may be advantageously utilized in the process of this invention. Polyvinyl butyral polymers are soluble in solvents such as lower alkanols having from one to four carbons which do not affect the photo-resist layer when the polymeric topcoat is applied. On the other hand, vinyl butyral polymers are soluble in photo-resist developers which are conventionally aromatic solvents such as benzene, toluene, xylene.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the method of forming protective hydrophobic photo-resist patterns on substrates by coating a substrate with a layer of a synthetic resin photo-resist, exposing the layer to a light pattern and developing the exposed layer by treating it with a predominantly aromatic hydrocarbon solvent to leave a photo-resist pattern corresponding to the light pattern covering portions of the substrate, the improvement which comprises:

coating the photo-resist layer prior to exposure with a transparent film of vinyl butyral polymer, said film being soluble in the developer solvent.

2. The method of claim 1 wherein said polymer is a copolymer comprising vinyl alcohol, vinyl acetate and a major portion of polyvinyl butyral.

3. The method of claim 2 wherein said copolymer comprises 88 percent copolymerized vinyl butyral, 9–12 percent copolymerized vinyl alcohol and up to 2.5 percent copolymerized vinyl acetate.

4. The method of claim 2 wherein said synthetic resin photo-resist comprises polyvinyl cinnamate.

5. The method of claim 2 wherein the film is coated on the photo-resist layer as a solution of the copolymer in a lower alkanol.

6. The method of claim 5 wherein said lower alkanol is isopropanol.

7. The method of claim 1 wherein said synthetic resin photo-resist comprises polyvinyl cinnamate.

8. The method of claim 1 wherein said photo-resist comprises polyvinyl cinnamate and a light sensitizer.

9. The method of claim 1 wherein the film is coated on the photo-resist layer as a solution of the vinyl butyral in a lower alkanol.

* * * * *